(12) United States Patent
Blossfeld et al.

(10) Patent No.: US 6,424,143 B1
(45) Date of Patent: Jul. 23, 2002

(54) PROCESS FOR MONITORING THE FUNCTION OF A SENSOR MODULE AND A SENSOR MODULE TO PERFORM THE PROCESS

(75) Inventors: Lothar Blossfeld, Breitnau; Ralf Janke, Gundelfingen, both of (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/322,934

(22) Filed: May 28, 1999

(30) Foreign Application Priority Data

May 30, 1998 (DE) .......................... 198 24 362

(51) Int. Cl.⁷ .............................. G01P 3/00; G01P 3/42
(52) U.S. Cl. .................. 324/160; 324/207.12; 324/225
(58) Field of Search .............................. 324/160, 173, 324/174, 207.12, 207.25, 537, 763, 225, 207.26, 234, 236, 239, 166, 168

(56) References Cited

U.S. PATENT DOCUMENTS 4,525,699 A * 6/1985 Buck et al. ................. 340/512
5,495,112 A    2/1996 Maloney et al.

FOREIGN PATENT DOCUMENTS

| DE | 22 50 717      | 10/1974 |
| DE | G 86 20 407.7 U1 | 3/1987 |
| DE | 38 29 875 A1   | 3/1990  |
| DE | 30 07 747 C2   | 5/1990  |
| DE | 195 10 416 A1  | 9/1996  |
| DE | 196 29 934 A1  | 7/1997  |
| JP |   05292571     | 11/1993 |

* cited by examiner

Primary Examiner—Walter E. Snow
(74) Attorney, Agent, or Firm—Akin, Gump, Strauss, Hauer & Feld, L.L.P.

(57) ABSTRACT

A sensor module (1) is constructed as a solid state integrated circuit (IC) and has a sensor (2) as well as at least one measuring amplifier (3), wherein the sensor module has external connections at least for the power supply and for the output measurement signal. In the sensor module an evaluation circuit (6) is provided that is connected to at least one internal measurement point of the circuit. The evaluation circuit (6) is connected to a modulator (10) for modulation of the supply current and/or the supply voltage and/or the output measurement signal, in order to output a diagnostic signal, which is formed from an internal circuit measurement value, via the available external connections of the sensor module.

19 Claims, 2 Drawing Sheets

PROCESS FOR MONITORING THE FUNCTION OF A SENSOR MODULE AND A SENSOR MODULE TO PERFORM THE PROCESS

BACKGROUND OF THE INVENTION

The invention relates to a process for monitoring the function of a sensor module, which is constructed as a solid state integrated circuit and which has a sensor and at least one measuring amplifier, wherein the sensor module has external connections at least for the power supply and for an output measurement signal.

The sensor module used for this can, in particular, involve a module having a magnetic field-dependant sensor, but sensor modules with other sensors, for example an optical sensor, a pressure sensor or the like, can also be used.

Sensor modules with magnetic field sensors (for example with a Hall sensor) are used, among other things, in the motor vehicle sector in camshaft/crankshaft applications or in ABS-systems. The rotational movement in these leads, for example, through a combination of rotating toothed gear and stationary magnets at the site of the sensor, to a magnetic signal that consists of a DC portion and an AC portion. By measurement of the AC portion, which is accomplished with static differential sensors having two magnetically sensitive surfaces or dynamic sensors having one magnetically sensitive surface, the rotational movement is converted, for example by the Hall effect, into a voltage that leads, in a sensor module with a digital output measurement signal, through a Schmitt trigger circuit, to a switching operation at the output of the sensor module.

As a function of the ambient temperature of the sensor module, which can be installed in the engine compartment of a motor vehicle, for example, the separation distances of the toothed gear-magnet sensor-magnet can change, so that both the AC portion and the DC portion of the magnetic field are changed at the site of the magnet sensor. This can also occur through wear of a mechanical component in the course of the operating time. This drop in the AC portion caused by outside circumstances can lead to a sudden breakdown in the function of the application, when, for example, in a sensor module having a digital output, the value falls below a certain threshold value.

Such a breakdown of the system can, for example in motor management, result in considerable operational damages and also safety problems. The function of the sensor itself, in its parameters, is not the cause for a breakdown in these cases, but instead the ambient conditions changing in the surroundings of the sensor. The possibility for function monitoring is thus limited to the monitoring of the output measurement signal and thus to its presence in a sensor input signal.

SUMMARY OF THE INVENTION

An object of the present invention is to create a process for monitoring the function of a sensor module, as well as a sensor module suitable for this, so that an expanded monitoring of the function is possible, which also allows recognition of changing ambient conditions, so that countermeasures can be taken at the proper time prior to function breakdown. In the process, the expense for the sensor module should remain practically unchanged, and also its respectively provided structural shape should be kept.

In order to achieve these objectives, it is proposed in view of the process that circuit measurement values available within the sensor module be superimposed as modulation signals on the supply current and/or the supply voltage and/or the output measurement signal, and be output via the available external connections as diagnostic signals, and that either the internal circuit measurement values be output as analog or digital modulations and the output measurement signal be output as a digital value, or that the internal circuit measurement values be output as digital modulations and the output measurement signal be output as an analog value.

Using the internal circuit measurement values, the tendency of the measurement conditions of the sensor module to change can be recognized at the proper time in advance, here prior to a breakdown of sensor function, i.e. before the output measurement signal can no longer be evaluated or is no longer present. The internal circuit measurement values, which allow recognition of the changing ambient conditions, are superimposed on the output measurement signal as modulation, for example. Thus, a corresponding diagnostic signal is available to the outside. By the modulation of the output signal, optionally also of the supply current or the supply voltage, the functional values remain unchanged, so that there is no interruption of the measuring function or the output measurement signal. It is further advantageous that the available connections for the output of the diagnostic signal be used as well, and consequently, that the structural shape of the sensor module and its connection configuration remain unchanged.

Expediently, for a digital output measurement signal, at least one measurement value proportional to the sensor signals is collected as a circuit measurement value and is output as a diagnostic value via the available external connections. The digital output measurement signal is only available when the amplitude of the sensor signal exceeds a respective preset threshold value. If this threshold value is not reached, then accordingly no more output signals are emitted and a sudden function breakdown is the result. Since, however, according to the invention, a measurement value proportional to the sensor signal is collected inside the circuit as a circuit measurement value and is available externally as a diagnostic signal, the danger can be recognized, in the present case, at the proper time prior to function breakdown using a changing amplitude of the sensor signal, and corresponding countermeasures can be taken.

There is also the possibility, however if necessary, that in combination with the aforementioned measure, an offset voltage or the offset current, the temperature, filter coefficients and similar internal operating data of the circuit are collected as circuit measurement values and output as a diagnostic signal via the available external connections. Also in these internal circuit measurement values, changing external ambient conditions can be recognized.

A further refinement of the process according to the invention provides that the diagnostic signal be called up from the outside via the available external connections, in particular by means of a call-up (request) modulation signal that can be supplied via the available outside connections. In many applications, changes of ambient conditions are only expected at longer time intervals, so that it is sufficient herein to call up diagnostic values at predetermined time intervals.

The invention also relates to a sensor module which is constructed as a solid state integrated circuit and has a sensor as well as at least one measuring amplifier, wherein the sensor module has external connections at least for power supply and for the output measurement signal.

This sensor module is characterized according to the invention in that in the sensor module an evaluation circuit is provided, which is connected to at least one internal measurement point of the circuit, and that the evaluation circuit is connected to a modulator for the modulation of the supply current and/or the supply voltage and/or the output measurement signal, in order to output a diagnostic signal, which is formed from an internal circuit measurement value, via the available external connections of the sensor module.

As already explained in connection with the process according to the invention, in this sensor module according to the invention, via the available external connections, aside from the output measurement signal, an access to internal circuit measurement points is also available, and the measurement values available through it make possible a diagnosis of circuit function. In particular, it is thereby recognizable at what (safety) distance the circuit is operating from its operating limits. From that the appropriate countermeasures can be taken at the proper time prior to breakdown of the operating function. By modulating up the diagnostic values to the available measurement quantities or supply quantities, no additional connections are necessary, so that the structural shape of the sensor module and its connection configuration can remain unchanged. In the given applications, the sensor modules used until now can thus be replaced without problems by the sensor modules according to the invention, without changes to the circuit being necessary.

An advantageous use of a sensor module according to the invention is available for a rotational speed measurement with simultaneous distance measurement of the sensor or the sensor module from an emitter. For example, such a use is possible in a motor vehicle, that is equipped with an ABS-system, wherein the rotational speed of the rims is measured using magnetic field sensors. The rotation is measured with a toothed gear that has the same rotational speed as the wheel itself. The wear and tear on the brake lining causes larger activation paths to result for the brake cylinder over the course of the useful life of the brake lining. By the coupling of this movement with the position of the sensor provided for the rotational speed measurement, the possibility is created to detect, using a single sensor, both the rotational movement and the change in the amplitude (AC portion), which becomes adjusted by the distance change for brake linings that wear over time.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1:
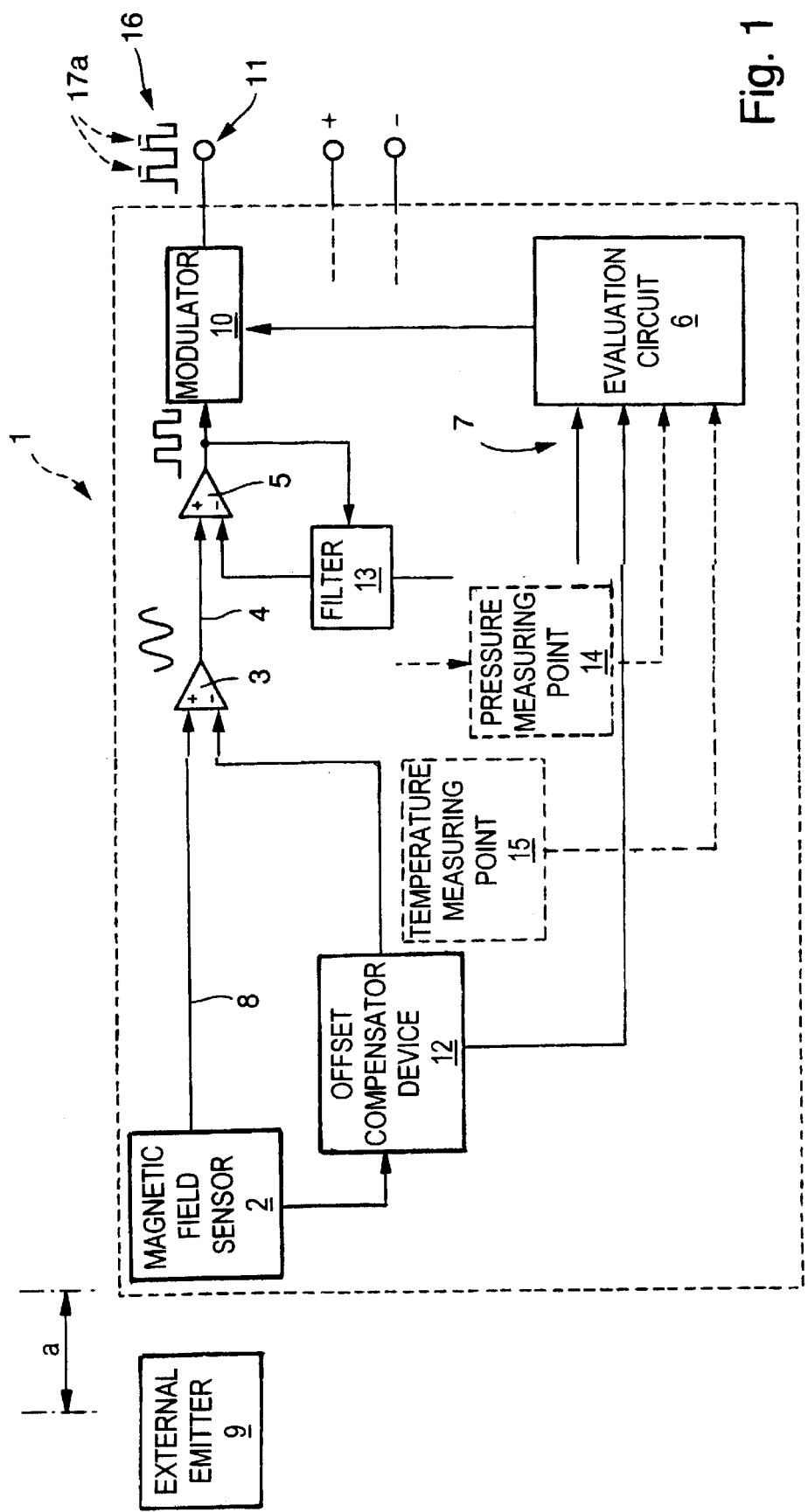
FIG. 1 is a schematic representation of a sensor module with function blocks.

A sensor module 1 shown in block representation in FIG. 1 functions for the measurement or detection of magnetic fields and, for this purpose, has a magnetic field sensor 2. This magnetic field sensor is connected to a measuring amplifier 3, at whose output 4 an amplified measurement value appears that is proportional to the sensor signal. Via a Schmitt trigger 5 connected after the measuring amplifier, a signal formation and digitalization of the amplified measurement signal occurs. This output signal of the Schmitt trigger 5 formed the output measurement signal in digital sensor modules used until now.

The Schmitt trigger 5 switches from one stable condition into another when a certain input voltage level is exceeded or fallen below. If the amplitude of the AC portion of the voltage appearing at the output 4 of the measurement amplifier 3 now changes, and consequently the input voltage of the Schmitt trigger 5, then the Schmitt trigger no longer emits an output signal, when the value falls below a predetermined threshold value.

In order to make this sudden breakdown of the function predictable, the sensor module 1 according to the invention is provided with an evaluation circuit 6, which is connected at one or more internal measurement points of the circuit. Among other things, the possibility exists that such a measurement input 7 is connected to the sensor output 8, emitting an analog circuit measurement value, or to the output 4 of the measurement amplifier 3. With the evaluation circuit 6, it can then be detected, for example, that for a change of the distance "a" to an external emitter 9, the AC voltage portion of the measurement signal appearing at the sensor output 8 or amplifier output 4 has dropped. This information is immediately available when a change of the ambient conditions has occurred, for example a change of the distance "a" between emitter 9 and magnetic field sensor 2. Thus, a reaction can be made at the proper time prior to reaching the operating limits of the Schmitt trigger, and countermeasures can be taken in order to prevent a sudden breakdown of the system. These changes of the input signal would not be recognizable at the output of the Schmitt trigger 5, within the operating limits of the Schmitt trigger.

In order to bring the information available in the evaluation circuit 6 to the outside, the internally detected measurement values are given as modulation signals to a modulator 10, which superimposes them, in the present case, on the output measurement signal of the Schmitt trigger 5. At the outside connection 11 for the output measurement signal, a superimposed diagnostic signal is also available at the same time, which allows a conclusion to be made about the instantaneous operating point of the circuit.

The measurement inputs 7 of the evaluation circuit 6 can be connected to the most varied internal measurement points of the circuit. In the present embodiment (FIG. 1), an offset compensator device 12 is connected in circuit between the magnetic field sensor 2 and the measurement amplifier 3, at which the offset voltage or the offset current is determined as a circuit measurement value and supplied to the evaluation circuit 6. The monitoring of the offset compensation allows conclusions to be reached about the internal functional situation of the circuit. The same applies for the monitoring of a filter circuit with a filter 13, to which the evaluation circuit 6 is connected, so that the filter coefficients can be collected, for example, as internal operating data.

These are merely examples for internal measuring points, at which the evaluation circuit 6 can be connected. It is indicated by dashed lines that still more measuring points, for example a pressure measuring point 14 and a temperature measuring point 15, can also be connected to the evaluation circuit 6. The measuring data furnished by the pressure measuring point 14 can, for example, be significant for the type of installation of the sensor module, because this measuring value gives a statement as to whether the installation position and the manner of installation of the sensor module are influencing the function of the circuit in a disadvantageous manner.

In any case, information can be given about the diagnostic signals, which allow conclusions to be reached about the instantaneous operating point of the circuit. Changes, that move in the direction of the operating limits of the sensor module, can thus be evaluated at the proper time before a total breakdown of the sensor module occurs. The cause for such a total breakdown is generally to be sought in the environment of the sensor through changing ambient conditions, for example through enlargement of the distance between the magnetic field sensor 2 and an emitter 9.

Figure 2:
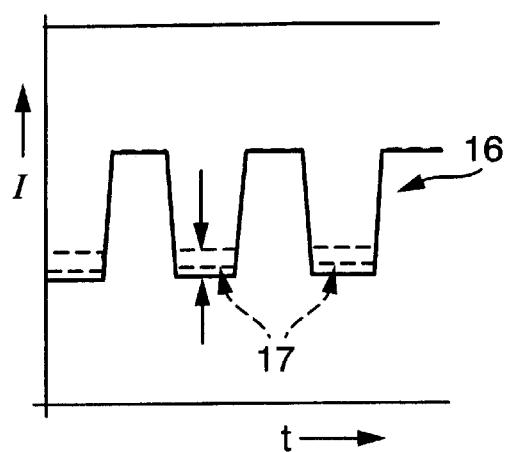
FIGS. 2 to 4 are diagrams of the output measurement signal with different diagnostic signals that have been modulated up.
Figure 3:
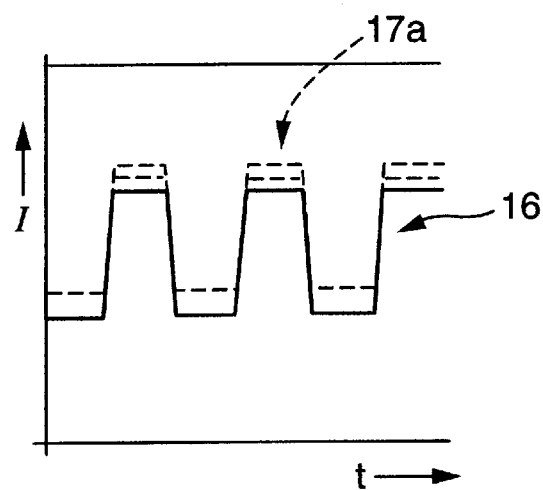
Figure 4:
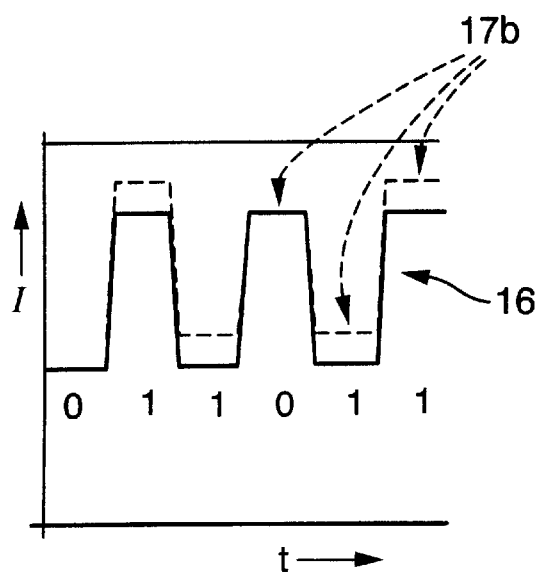

FIGS. 2 to 4 show in diagrams the digital output measurement signals 16, as they can appear at the external connection 11 of the sensor module 1 shown in FIG. 1. In FIGS. 2 to 4, using different modulation types, possibilities are shown of how diagnostic signals 17 can be superimposed on the output measurement signal 16. It is also significant herein that the information content of the output measurement signal 16 remains unchanged in the superimposition with the diagnostic signal 17, and stays continuously available.

In the three diagrams according to FIGS. 2 to 4, the time t is plotted on the abscissa (x-axis), and the current consumption I is plotted on the ordinate (y-axis). This involves, for the corresponding sensor module, one that has a current output. For a sensor having voltage output, the output voltage would be plotted on the ordinate (y-axis). The output measurement signal 16 is a rectangular output signal in which the current level alternates between "low" and "high".

According to FIG. 2, an analog output of the diagnostic signal is provided through a change of the low-current level. The deviation of the marked-in diagnostic signal 17, drawn in dashed lines with two different values, from the low current level as a reference quantity, represents a proportional diagnostic value, that is allocated to a certain measurement function. For example, this proportional diagnostic value can represent a distance "a" present between the magnetic field sensor 2 and an emitter 9.

In the diagram shown in FIG. 3, an analog diagnostic signal 17a is superimposed on the digital output measurement signal 16, such that the proportional deviation of the high-current level represents the diagnostic value.

Aside from the analog output of the diagnostic signal, a digital output can also occur, as is depicted in FIG. 4. The diagnostic signal 17b is superimposed on the output measurement signal 16, such that this occurs via a change of the low-current and/or high-current level. The output measurement signal section shown in FIG. 4 contains the binary sequence 011011 as digital diagnostic information.

In the embodiment shown, a digital output of the output measurement signal 16 and an analog (FIGS. 2 and 3) or digital modulation (FIG. 4) of the output measurement signal occurs. However, the possibility also exists that the output measurement signal is output as an analog value, and the modulation is done digitally.

The output of the diagnostic signal can, in addition, occur in all sorts of variations, so that between the internally measured circuit measurement value and the diagnostic signal emitted to the outside, aside from a linear relation, logarithmic or other non-linear functions can also be provided.

In FIG. 1, a sensor module 1 is shown with a three-pin housing, wherein the output measurement signal 16 and the diagnostic signal superimposed on it appears at the pin 11. The two other pins function for the power supply of the sensor module.

The invention can also be realized with a two-pin housing, in which the output measurement signal is contained in the two operating conditions "high current consumption" and "low current consumption." The output of the diagnostic signal occurs as analog or digital by a change of the high-level or low-level, as was described with respect to FIGS. 2 to 4. In the sensor module shown in FIG. 1, this involves a solid state integrated circuit, in which the evaluation circuit 6 with modulator 10 and the like are integral components.

Aside from the aforementioned use of the sensor module 1 for a rotational speed measurement with simultaneous distance measurement of the sensor 2 from an emitter 9, for example in a motor vehicle, where the rotational speed of a wheel is detected and simultaneously the wear and tear of the brake lining are monitored, a use for camshaft/crankshaft applications and similar uses are also possible. In all of these applications, a change and especially a worsening of the AC-portion and the ratio of the AC/DC portions can be measured using the diagnostic signal. By a corresponding wiring with a controller module, a helpful statement about the performance capability and function situation of the system is available. A wear of mechanical components can certainly not be prevented thereby, but the possibility exists for predicting a sudden breakdown of the sensor at the right time, for example using the measurement of the magnetic AC-portion, in order to then induce appropriate measures prior to a breakdown.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A process for monitoring the integrity of a sensor module having a modulator, the process comprising:
   (a) receiving a measurement signal at a first input of the modulator;
   (b) outputting the measurement signal from the sensor module;
   (c) monitoring and evaluating one or more internal function measurement values available within the sensor module;
   (d) converting the values into modulation signals;
   (e) receiving the modulation signals at a second input of the modulator; and
   (f) superimposing the modulation signals on the measurement signal.

2. The process of claim 1, wherein a change in distance between a sensor residing in the sensor module and an emitter external to the sensor module is detected.

3. The process of claim 2, wherein the process is used to measure rotational speed.

4. The process of claim 1, wherein the modulation signals are digital or analog modulation signals.

5. The process of claim 1, wherein the modulation signals are diagnostic signals.

6. The process of claim 1, wherein the measurement signal is outputted as a digital or analog value.

7. The process of claim 1, wherein the measurements include at least one of an offset voltage, an offset current, temperature, pressure, and filter coefficients.

8. The process of claim 1, wherein a diagnostic signal is called up in response to an external request modulation signal inputted into the sensor module.

9. A sensor module, comprising:
   (a) a modulator which receives a measurement signal at a first input and outputs the measurement signal from the sensor module; and
   (b) an evaluation circuit which monitors and evaluates one or more internal function measurement values available within the sensor module and converts the values into modulation signals, wherein the modulation signals are transmitted from the evaluation circuit to a second input of the modulator and the modulation signals are superimposed on the measurement signal.

10. The sensor module of claim 9, further comprising:
    (c) an internal sensor in communication with an external emitter;
    (d) a measurement amplifier in communication with the internal sensor;
    (e) a Schmitt trigger in communication with the measurement amplifier and the modulator;
    (f) a filter in communication with the Schmitt trigger and the evaluation circuit; and
    (g) an offset compensator device in communication with the internal sensor, the measurement amplifier and the evaluation circuit.

11. The sensor module of claim 10, wherein the internal sensor is a magnetic field sensor.

12. The sensor module of claim 11, wherein the evaluation circuit detects a change in distance between the internal sensor and the external emitter.

13. The sensor module of claim 12, wherein the sensor module is used to measure rotational speed.

14. The sensor module of claim 9, wherein the modulation signals are digital or analog modulation signals.

15. The sensor module of claim 9, wherein the modulation signals are diagnostic signals.

16. The sensor module of claim 9, wherein the measurement signal is outputted as a digital or analog value.

17. The sensor module of claim 9, wherein the values include at least one of an offset voltage, an offset current, temperature, pressure, and filter coefficients.

18. The sensor module of claim 9, wherein a diagnostic signal is called up in response to an external request modulation signal inputted into the sensor module.

19. The sensor module of claim 9, wherein the sensor module is constructed as a solid state integrated circuit (IC).

* * * * *